United States Patent
Keller et al.

(10) Patent No.: US 11,054,445 B2
(45) Date of Patent: Jul. 6, 2021

(54) MEASURING DEVICE AND MEASURING METHOD WITH MULTIPLE DISPLAY

(71) Applicant: Rohde & Schwarz GmbH & Co. KG, Munich (DE)

(72) Inventors: Matthias Keller, Kirchheim (DE); Wolfgang Wendler, Grobenzell (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 532 days.

(21) Appl. No.: 14/784,579

(22) PCT Filed: Apr. 8, 2014

(86) PCT No.: PCT/EP2014/057048
§ 371 (c)(1),
(2) Date: Oct. 14, 2015

(87) PCT Pub. No.: WO2014/170172
PCT Pub. Date: Oct. 23, 2014

(65) Prior Publication Data
US 2016/0069932 A1    Mar. 10, 2016

(30) Foreign Application Priority Data
Apr. 15, 2013   (DE) .......................... 102013206711.9

(51) Int. Cl.
*G01R 13/02*   (2006.01)
(52) U.S. Cl.
CPC ......... *G01R 13/02* (2013.01); *G01R 13/0236* (2013.01); *G01R 13/029* (2013.01)

(58) Field of Classification Search
None
See application file for complete search history.

(56) References Cited

U.S. PATENT DOCUMENTS

| 4,816,767 A | * | 3/1989 | Cannon | .................. G01R 23/16 324/601 |
| 5,081,592 A | | 1/1992 | Jenq | |
| 6,151,010 A | * | 11/2000 | Miller et al. | ............. G09G 5/36 345/134 |

(Continued)

FOREIGN PATENT DOCUMENTS

| DE | WO009744677 | * | 11/1997 |
| DE | 69723439 T2 | | 6/2004 |

(Continued)

OTHER PUBLICATIONS

HPSpectrumAnalysis—Thomas et al.—Back to Basics eSeminar—Feb. 18, 2003.*

(Continued)

*Primary Examiner* — James G Norman
(74) *Attorney, Agent, or Firm* — Potomac Technology Law, LLC

(57) ABSTRACT

The invention relates to a measuring device and a measurement method for the display of a measurement signal connected to the measuring device. The measuring device comprises a measurement-signal input, a measurement-parameter input, a calculation unit and a display unit for the display of calculated statistical signals. The measuring device is set up to display a plurality of statistical signals in parallel on the display unit in real-time.

14 Claims, 4 Drawing Sheets

(56) References Cited

U.S. PATENT DOCUMENTS

| | | |
|---|---|---|
| 6,571,185 B1 | 5/2003 | Gauland et al. |
| 2003/0107573 A1 | 6/2003 | Miller et al. |
| 2003/0208328 A1 | 11/2003 | Pickerd |
| 2007/0018985 A1 | 1/2007 | Campiche et al. |
| 2015/0088447 A1 | 3/2015 | Toender et al. |
| 2015/0111506 A1 | 4/2015 | Franke et al. |

FOREIGN PATENT DOCUMENTS

| | | |
|---|---|---|
| DE | 102011077390 A1 | 12/2012 |
| DE | 102011078409 A1 | 1/2013 |
| DE | 102011080730 A1 | 2/2013 |
| EP | 1085328 A2 | 3/2001 |
| JP | H08201451 A | 8/1996 |
| WO | WO9744677 A1 | 11/1997 |
| WO | WO2007056673 A2 | 5/2007 |

OTHER PUBLICATIONS

"International Preliminary Report on Patentability (English Translation)", PCT/EP2014/057048, dated Oct. 20, 2015.

DE102013206711.9 Office Action, Germany Patent Office, dated Sep. 28, 2020.

\* cited by examiner

MEASURING DEVICE AND MEASURING METHOD WITH MULTIPLE DISPLAY

PRIORITY

The present application is a U.S. national phase application under 35 U.S.C. § 371 of PCT application No. PCT/EP2014/057048 (filed 2014-04-08), which claims priority to German Patent Application No. DE 102013206711.9 (filed 2013-04-15), the entireties of which are hereby incorporated by reference herein.

BACKGROUND

Measuring devices, especially spectrum analyzers, are used in high-frequency technology to perform analyses of a measurement signal under investigation. In this context, the demands on the measuring device increase with the bandwidth and complexity of the measurement signal under investigation. In particular, measuring devices are required for real-time measurement with analysis bandwidths up to several hundred megahertz (MHz).

A broadband spectrum analyzer is known from WO 2007/056673 A2 which can implement static evaluations of the measurement signal based on a real-time frequency-spectrum analysis. In this context, a Fast-Fourier-Transform filter, abbreviated as FFT filter, is used. Since the spectral bandwidth of the FFT filter is restricted to 110 MHz, signals with a relatively broader bandwidth are analyzed in a sequential manner. For this purpose, the broadband signals are subdivided into 110-MHz segments, and each segment is analyzed in succession. This has the disadvantage that very broadband signals provide a large number of segments. In the case of broadband signals of this kind and with correspondingly high segment numbers, a real-time analysis is very calculation intensive and therefore time intensive.

In the case of broadband measurement signals, the sub-region of the measurement signal under investigation (English: Region-Of-Interest (ROI)) is often only a small part of the overall frequency spectrum of the measurement signal. Accordingly, a substantial part of the analysis time is expended on irrelevant sub-regions (English: Regions-of-Non-Interest (RONI)), so that the overall signal analysis is time-inefficient. This is particularly problematic, if several regions of interest (ROI) in the spectrum are to be analyzed, wherein, however, a broadband region of non-interest (RONI) is disposed between the two regions of interest, which must then, disadvantageously, also be analyzed.

Additionally, the display of a very broadband measurement signal on only one display means that the regions of interest under investigation are displayed too small or respectively cannot be analyzed adequately.

What is needed, therefore, is a measurement approach whereby an analysis of a broadband measurement signal can be implemented rapidly and flexibly. In this context, in particular, statistical evaluation signals of the broadband measurement signal should be calculated and analyzed in real-time.

SOME EXAMPLE EMBODIMENTS

Embodiments of the present invention advantageously address the foregoing requirements and needs, as well as others, by providing for a measurement approach facilitating an analysis of a broadband measurement signal is implemented rapidly and flexibly, wherein statistical evaluation signals of the broadband measurement signal are calculated and analyzed in real-time.

In accordance with example embodiments, a measuring device is provided for the display of a measurement signal connected to the measuring device. The measuring device provides a measurement-signal input, a calculation unit for the calculation of a statistical signal based on the connected measurement signal and a display unit for the display of the calculated statistical signal. Further, it is provided that the measuring device is set up to display in parallel a plurality of statistical signals based on the one connected measurement signal on the display unit.

In this context, the calculated statistical signal is displayed in real-time. In accordance with such a real-time display, the display of signals occurs at the actual time by contrast with simulated or reconstructed time. The measuring device according to example embodiments of the invention is a real-time device, the measurement method according to example embodiments of the invention is a real-time method. The calculated statistical signal to be displayed in this context is therefore a signal without dead time resulting from the signal processing.

By way of example, histograms are intended as the statistical signals to be displayed on the basis of the connected measurement signal. A histogram is a graphic display of the distribution of frequencies of occurrence of registered measured values on the basis of the connected measurement signal.

According to one such embodiment, the calculation of the signals is implemented by means of the calculation unit in the measuring device. In particular, the course of a distribution of frequencies of occurrence over the region of interest under investigation can therefore be displayed. However, the display of the histograms is very calculation-intensive and determines a certain duration of analysis.

According to further embodiments of the invention, the display unit is subdivided. As a result of the subdivision, the statistical signal calculated on the basis of the connected measurement signal can be displayed in several different display regions of the display unit.

By way of example, the measuring device calculates the statistical signals on the basis of the overall bandwidth of the measurement signal, wherein the overall measurement range provides a measurement-range beginning and a measurement-range end. Each of the parallel displays represents a region of interest under investigation within the overall measurement range.

Such embodiments thereby provide for the advantage that a different region of interest of the measurement signal to be analyzed can be displayed in each of the display regions. In this context, each region of interest under investigation can be analyzed individually. The display regions can be accurately defined corresponding to the parameters of the region of interest. A precise display of a region of interest with small bandwidth by comparison with the overall measurement range can be advantageously implemented in this context.

Such embodiments thereby provide for the further advantage that only one measurement-signal input of the measuring device needs to be used in order to display several regions of interest in parallel, because the subdivision of the display unit for the parallel display of the region of interest under investigation takes place within the measuring device itself.

By way of further example, the regions of non-interest (RONI) in the overall measurement range are not displayed.

Accordingly, it is advantageously achieved that irrelevant regions of non-interest are not analyzed. As a result, the analysis time for a real-time analysis of the connected measurement signal is considerably reduced, if the irrelevant region of non-interest is very broadband by comparison with the region (or regions) of interest. The analysis of the measurement signal is therefore performed more rapidly and substantially more efficiently.

According to further embodiments, each of the parallel display regions can be individually adjusted through an individual parametrization of the display unit via a measurement-parameter input. It is therefore possible to adjust a targeted and rapid analysis of the connected measurement signal by matching the measurement parameters to the requirements for the various regions of interest under investigation.

According to further embodiments, a separate mask trigger is used for each of the parallel display, especially a frequency-mask trigger. Now, with an appropriate trigger function, each region of interest under investigation can be analyzed and matched individually. In particular, trigger functions in which the trigger conditions occur rarely or the trigger conditions are difficult to adjust, can thus be realized in a simple manner.

According to further embodiments, each of the parallel displays can be advantageously updated in a periodic-sequential manner. This allows a constantly updated, real-time analysis of the signal, wherein, by masking out irrelevant regions of non-interest, unnecessary waiting time is not expended.

By way of example, a first resolution bandwidth can be adjusted for a first region of interest, and a second resolution bandwidth can be adjusted for a second region of interest. The first resolution bandwidth is different from the second resolution bandwidth. Especially in the case of broadband signals, this allows a flexible, matched analysis.

By way of further example, instead of a resolution bandwidth, a parametrization of this kind can also be obtained by adjusting the measurement level and/or the trigger conditions.

In accordance with example embodiments, a measurement method is also provided. The measurement method for the display of a measurement signal connected to a measuring device comprises the method steps: connection of a measurement signal to a measurement-signal input; calculation of a statistical signal based on the connected measurement signal by means of a calculation unit; and display of the calculated statistical signal on a display unit. Further, a plurality of statistical signals based on a connected measurement signal is displayed in parallel on the display unit.

BRIEF DESCRIPTION OF THE DRAWINGS

These and other features, aspects and advantages of the present invention are explained in greater detail on the basis of the Figures of the drawings, wherein the drawings describe only exemplary embodiments of the invention. Identical components in the drawings are provided with identical reference numbers. Accordingly, embodiments of the present invention are illustrated by way of example, and not by way of limitation, in the figures of the accompanying, in which.

DETAILED DESCRIPTION

Measurement approaches facilitating an analysis of a broadband measurement signal is implemented rapidly and flexibly, wherein statistical evaluation signals of the broadband measurement signal are calculated and analyzed in real-time, are provided. In the following description, for the purposes of explanation, numerous specific details are set forth in order to provide a thorough understanding of the embodiments of the invention. It is apparent, however, to one skilled in the art that the embodiments of the invention may be practiced without these specific details or with an equivalent arrangement. In other instances, well-known structures and devices are shown in block diagram form in order to avoid unnecessarily obscuring the embodiments of the invention.

Figure 1:
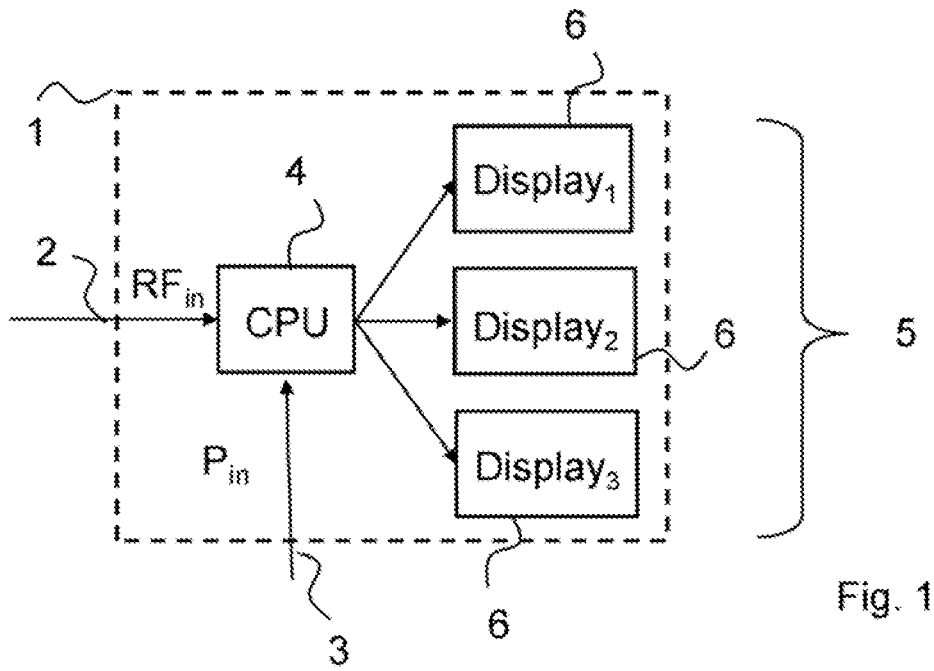
FIG. 1 shows a block-circuit diagram of a measuring device according to example embodiments of the invention.

FIG. 1 shows a first exemplary embodiment of a measuring device 1 according to an example embodiment of the invention. The measuring device 1 comprises a measurement-signal input 2 to which a broadband measurement signal $RF_{in}$ is connected. The measuring device 1 further provides a measurement-parameter input 3, to which a measurement-parameter signal $P_{in}$ is connected. Starting from the measurement parameters $P_{in}$, a calculation unit 4 calculates a signal to be displayed from the broadband measurement signal $RF_{in}$. For example, the calculation unit calculates a statistical signal, especially a histogram, of parts of the frequency spectrum of the connected measurement signal $RF_{in}$. The calculated signal is supplied to three display regions 6 of a display unit 5.

In this context, the measurement-parameter input 3 of the measuring device 1 can be an interface to a further terminal device. By way of example, the measurement-parameter input 3 is a user-machine interface, so that the user of the measuring device 1 adjusts corresponding parameters for the analysis of the measurement signal $RF_{in}$ directly in the measuring device 1. These parameters are provided as $P_{in}$ to the calculation unit 4.

A first region of interest $ROI_1$ under investigation of the connected measurement signal $RF_{in}$ is displayed in the first display region 6 of the display unit 5. In parallel, a second region of interest $ROI_2$ under investigation of the same measurement signal $RF_{in}$ is displayed in the second display region 6 of the display unit 5. The first and the second display region 6 of the display unit 5 are accordingly directed towards different regions of interest ROI in an overall measurement range 11 of the measurement signal $RF_{in}$.

Figure 2:
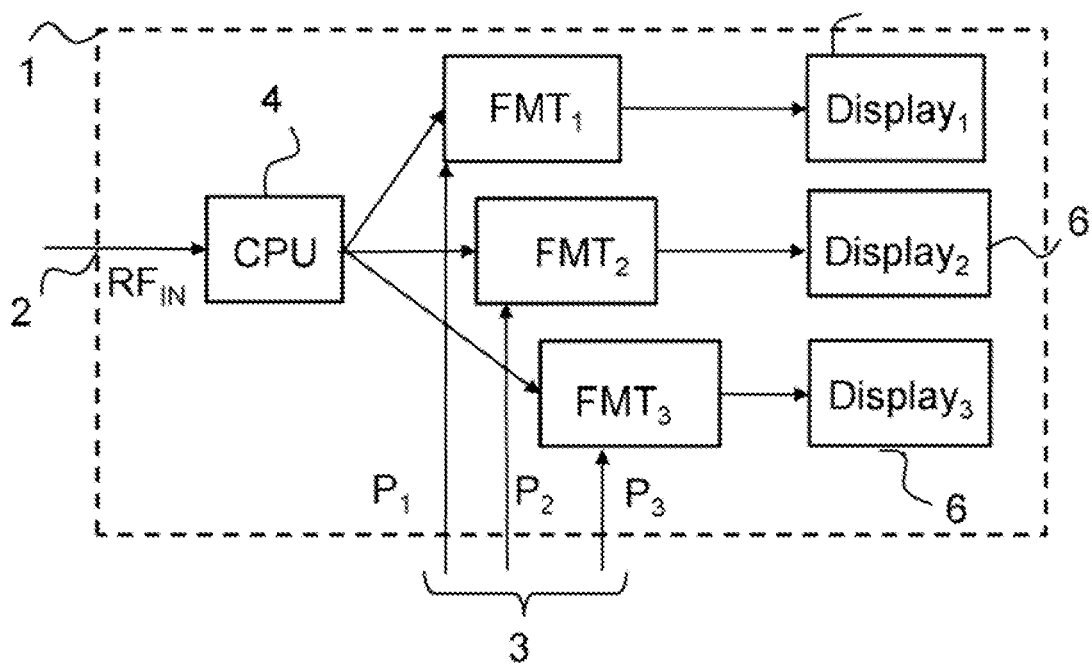
FIG. 2 shows a further block-circuit diagram of the measuring device of FIG. 1 according to example embodiments of the invention.

FIG. 2 shows a further embodiment of the measuring device 1 of FIG. 1. By way of difference from FIG. 1, FIG. 2 shows a frequency mask trigger 7 provided for every display region 6 of the display unit 5. Each of the frequency mask triggers 7 of the measuring device 1 is individually adjusted via its own parametrization $P_1$, $P_2$, $P_3$. This individual parametrization $P_1$, $P_2$, $P_3$ is provided through a dedicated input 3 to every frequency-mask trigger 7.

The measuring device 1 from FIG. 2 can also provide an interface to a further terminal device, in order to make the parametrization $P_1$, $P_2$, $P_3$ of the respective frequency mask trigger 7 available to the measuring device 1. Alternatively, the measurement-parameter input 3 represents a user interface.

Figure 3:
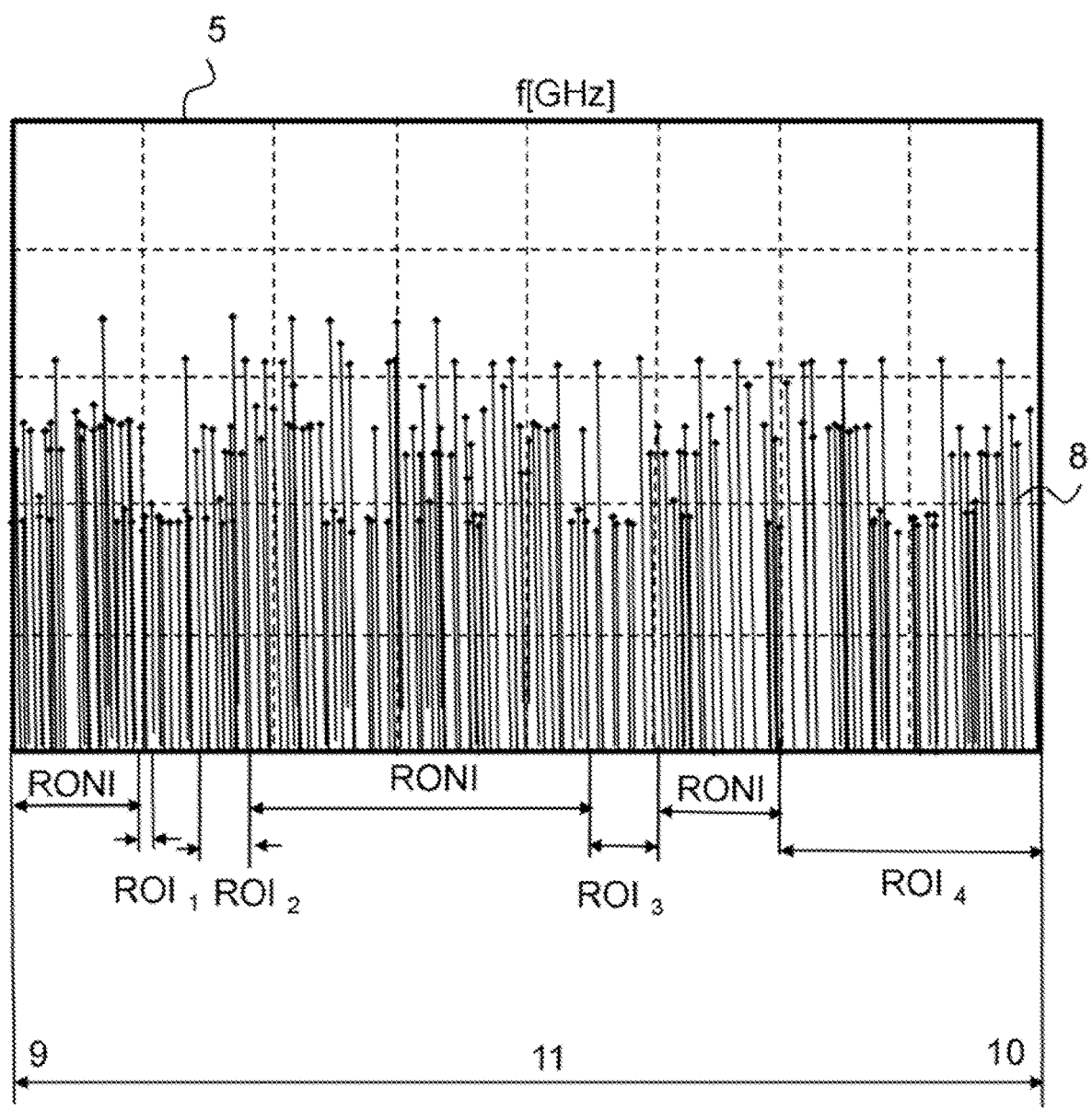
FIG. 3 shows the display of a calculated statistical signal according to current measuring devices.

FIG. 3 shows a display unit 5 of a measuring device according to the prior art. The display unit 5 in this context displays a histogram 8 of a measurement signal $RF_{in}$ connected to the measuring device 1. A histogram 8 of the entire bandwidth B of the measurement signal $RF_{in}$ is illustrated here so that the overall measurement range 11 is displayed. In this case, the bandwidth B amounts to several gigahertz. The overall measurement range 11 provides a measurement-range beginning 9 and a measurement-range end 10.

In conformity with the measurement tasks, four different regions of interest $ROI_1$ to $ROI_4$ under investigation of the measurement signal $RF_{in}$ are to be analyzed. Accordingly, it is evident from FIG. 3 that the bandwidths of the regions of interest $ROI_1$ to $ROI_4$ under investigation only add up, even in total, to a small fraction of the bandwidth of the overall measurement range 11 of the measurement signal $RF_{in}$. Regions between the regions of interest $ROI_1$ to $ROI_4$ under investigation are displayed as regions of non-interest RONI not under investigation.

Since a measuring device 1 always processes a region of interest 11 under investigation sequentially dependent upon the sampling rate, especially in the case of this broadband measurement signal $RF_{in}$, the majority of the analysis time is used to calculate and display statistical signals starting from irrelevant regions RONI of the measurement signal $RF_{in}$. As a result, the analysis of the measurement signal $RF_{in}$ is very calculation-intensive and inefficient.

It is also evident from FIG. 3 that, especially narrowband regions of interest ROI under investigation, here, for example $ROI_1$ or $ROI_3$, are only displayed with inadequate accuracy. A targeted analysis of these regions of interest $ROI_1$ or $ROI_3$ is therefore not possible.

Figure 4:
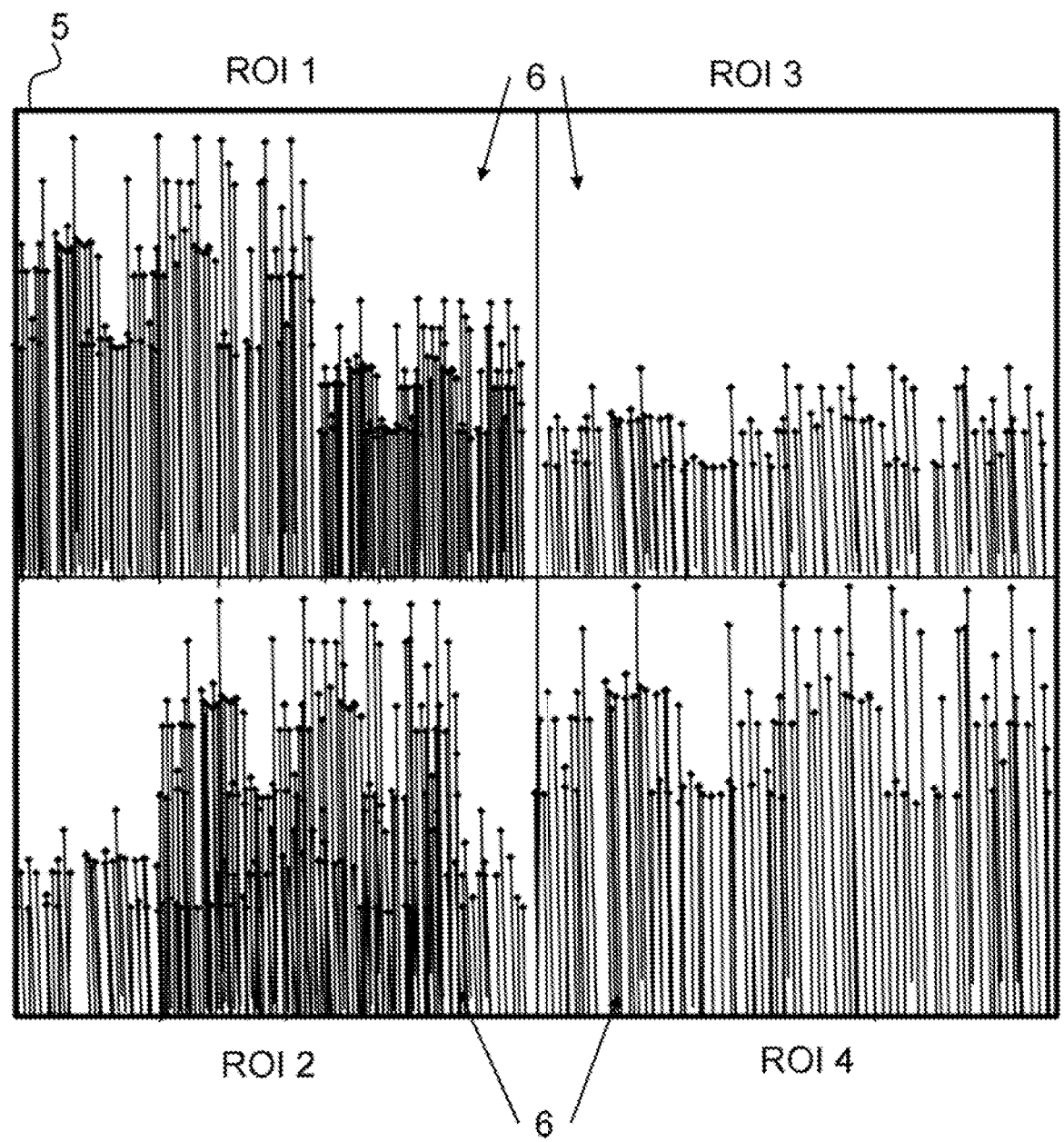
FIG. 4 shows a display of a calculated statistical measurement signal according to example embodiments of the invention.

FIG. 4 shows a display of calculated statistical signals based on a broadband measurement signal $RF_{in}$, according to embodiments of the invention. In this context, the display unit 5 is subdivided into four display regions 6. Neither the number of the display regions 6 nor the size of the individual display regions 6 relative to one another is restricted according to the invention. Each display region shown in FIG. 4 is of identical size.

Each display region 6 of the display unit 5 represents a region of interest ROI under investigation, wherein reference is made here to the regions of interest $ROI_1$ to $ROI_4$ under investigation as shown in FIG. 3. Accordingly, the first region of interest $ROI_1$ under investigation is displayed in the upper left-hand display region 6 of the display unit 5. The other regions of interest $ROI_2$ to $ROI_4$ are displayed respectively in the remaining display regions 6 of the display unit 5.

For every display region 6, the invention provides for an analysis of its own region of interest ROI in the connected measurement signal $RF_{in}$. This will be explained with reference to FIG. 5.

Figure 5:
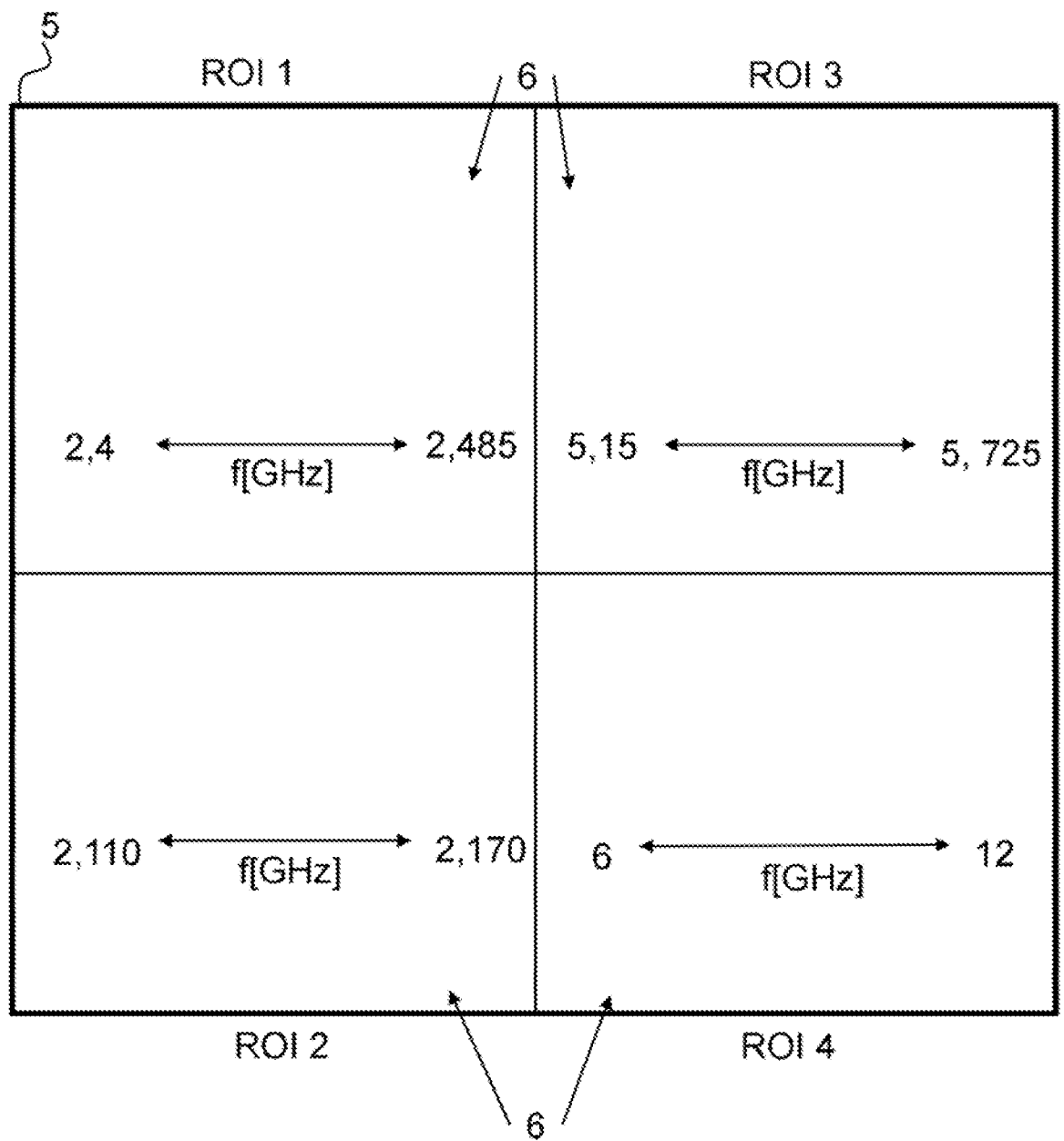
FIG. 5 shows a parametrization of the display regions according to example embodiments of the invention.

FIG. 5 shows schematically the parametrization of the display regions 6 illustrated in FIG. 4. The parameters according to FIG. 5 are supplied to the computer unit 4 of the measuring device 1 via the measurement-parameter input 3 of the measuring device 1 either by user entry or via an interface from another terminal device. In this context, FIGS. 4 and 5 should be considered in combination.

FIG. 5 shows parameters individually adjustable for every display region 6, especially the adjustable frequency range of every region of interest ROI. Alternatively, measurement-level values and/or trigger conditions can be used in order to display the regions of interest $ROI_1$ to $ROI_4$ under investigation.

According to FIG. 4 and FIG. 5, in this context, a histogram of the measurement signal $RF_{in}$ within the frequency range from 2.4 to 2.485 GHz is displayed in the first display region 6 of the display unit 5 as the first region of interest $ROI_1$ under investigation. This frequency range corresponds in this example to the communications frequency range of the WLAN standard according to IEEE 802.11b/g. The range displayed here corresponds to a bandwidth of only 85 MHz and can be resolved very finely by means of a corresponding resolution bandwidth.

A histogram of a second region of interest $ROI_2$ of the same measurement signal $RF_{in}$ is illustrated in the second display region 6 of the display unit 5. In this context, the region of interest $ROI_2$ is the downlink channel of the UMTS mobile radio network in the frequency range between 2.110 and 2.170 MHz. The second region of interest $ROI_2$ provides a bandwidth of 60 MHz and, alternatively to the first region of interest $ROI_1$, can therefore be displayed with an even finer resolution if a second resolution bandwidth is adjusted as a parameter.

The histogram of a third region of interest $ROI_3$ of the same measurement signal $RF_{in}$ is shown in the third display region 6 of the display unit 5. In this context, the $ROI_3$ is the communications frequency range from 5.15 to 5.725 GHz of the WLAN standard in conformity with IEEE 802.11n.

A histogram of a fourth region of interest $ROI_4$ of the same measurement signal $RF_{in}$ is presented in the fourth display region 6 of the display unit 5.

The bandwidth of a region of interest ROI according to the invention may be smaller than the analysis bandwidth of the measuring device 1. This analysis bandwidth of the measuring device 1 is, for example, 160 MHz, so that the regions of interest ROI provide a bandwidth equal to or less than 160 MHz. This has the advantage that the region of interest displays statistical signals in real-time.

Alternatively, individual regions of interest ROI can also provide a relatively larger bandwidth than the analysis bandwidth of the measuring device 1. For example, the bandwidth of the fourth region of interest $ROI_4$ in FIGS. 4 and 5 is six GHz, so that the $ROI_4$ allows a broadband analysis over a frequency range from 6 to 12 GHz. The $ROI_4$ can then no longer be displayed in real-time.

Because of the different bandwidths of the individual regions of interest ROI, different analysis bandwidths should be specified for each region of interest ROI.

With such example embodiments of the invention, several histograms of the same measurement signal $RF_{in}$ can be displayed in different display regions 6 of a display unit 5 of a measuring device 1. In this context, it is not the overall continuous measurement range 11 that is analyzed, but rather, the regions of interest ROI under investigation are consciously selected via a corresponding parametrization, displayed and then investigated. The irrelevant regions of non-interest RONI are thus not analyzed, thereby saving analysis time.

All of the elements described and/or illustrated and/or claimed can be combined arbitrarily with one another within the scope of the invention.

While example embodiments of the present invention may provide for various implementations (e.g., including hardware, firmware and/or software components), and, unless stated otherwise, all functions are performed by a CPU or a processor executing computer executable program code stored in a non-transitory memory or computer-readable storage medium, the various components can be implemented in different configurations of hardware, firmware, software, and/or a combination thereof. Except as otherwise disclosed herein, the various components shown in outline or in block form in the figures are individually well known and their internal construction and operation are not critical either to the making or using of this invention or to a description of the best mode thereof.

In the preceding specification, various embodiments have been described with reference to the accompanying drawings. It will, however, be evident that various modifications may be made thereto, and additional embodiments may be implemented, without departing from the broader scope of the invention as set forth in the claims that follow. The specification and drawings are accordingly to be regarded in an illustrative rather than restrictive sense.

The invention claimed is:

1. A measuring device comprising:
a signal input configured to receive a radio frequency (RF) measurement signal;
a processor;
a data interface; and
a display; and
wherein the data interface is configured to receive one or more measurement parameters, and to provide the one or more measurement parameters to the processor;
wherein the processor is configured to analyze the measurement signal to determine a plurality of statistical signals based on the measurement signal and the measurement parameters, and wherein an overall measurement range of the measurement signal includes one or more regions of non-interest along with regions of interest and the analysis is performed based on the regions of interest and excludes the regions of non-interest;
wherein the processor is configured to control the display to display the plurality of statistical signals respectively in a plurality of regions of the display, in parallel, whereby each region of the display is configured to display the statistical signal associated with a respective region of interest of the measurement signal, and to exclude the regions of non-interest from the display; and
wherein a number of the regions of the display and/or a size of the regions of the display are variable.

2. The measuring device according to claim 1, wherein the statistical signal displayed within each region of the display is adjusted via individual parametrization based on a respective one of the one or more measurement parameters.

3. The measuring device according to claim 1, wherein each of the statistical signals is displayed within the respective display region based on a respective mask trigger.

4. The measuring device according to claim 1, wherein at least one of the regions of interest of the measurement signal is adjusted based on a respective resolution bandwidth.

5. The measuring device according to claim 4, wherein a plurality of the regions of interest of the measurement signal is each adjusted based on a different respective resolution bandwidth.

6. The measuring device according to claim 1, wherein at least one of the regions of interest of the measurement signal is adjusted based on a respective measurement level.

7. The measuring device according to claim 6, wherein a plurality of the regions of interest of the measurement signal is each adjusted based on a different respective measurement level.

8. The measuring device according to claim 1, wherein at least one of the regions of interest of the measurement signal is adjusted based on a respective trigger condition.

9. The measuring device according to claim 8, wherein a plurality of the regions of interest of the measurement signal is each adjusted based on a respective trigger condition.

10. A measurement method comprising:
receiving, by a measuring device, a radio frequency (RF) measurement signal;
receiving, by the measuring device, one or more measurement parameters;
analyzing the measurement signal, by a processor of the measuring device, and determining a plurality of statistical signals based on the measurement signal and the measurement parameters, wherein an overall measurement range of the measurement signal includes one or more regions of non-interest along with regions of interest and the analysis is performed based on the regions of interest and excludes the regions of non-interest; and
displaying the plurality of statistical signals respectively in a plurality of regions of a display, in parallel, whereby each region of the display displays the statistical signal associated with a respective region of interest of the measurement signal, and wherein the display excludes the regions of non-interest; and
wherein a number of the regions of the display and/or a size of the regions of the display are variable.

11. The measurement method according to claim 10, wherein the statistical signal displayed within each region of the display is adjusted via individual parametrization based on a respective one of the one or more measurement parameters.

12. The measurement method according to claim 10, wherein at least one of the regions of interest of the measurement signal is adjusted based on a respective resolution bandwidth.

13. The measurement method according to claim 10, wherein at least one of the regions of interest of the measurement signal is adjusted based on a respective measurement level.

14. The measurement method according to claim 10, wherein at least one of the regions of interest of the measurement signal is adjusted based on a respective trigger condition.

* * * * *